United States Patent
Kumar et al.

[11] Patent Number: 5,880,924
[45] Date of Patent: Mar. 9, 1999

[54] ELECTROSTATIC CHUCK CAPABLE OF RAPIDLY DECHUCKING A SUBSTRATE

[75] Inventors: Ananda H. Kumar, Milpitas; Shamouil Shamouilian, San Jose, both of Calif.

[73] Assignee: Applied Materials, Inc., Santa Clara, Calif.

[21] Appl. No.: 980,591

[22] Filed: Dec. 1, 1997

[51] Int. Cl.⁶ .................................................. H02N 13/00
[52] U.S. Cl. ........................................... 361/234; 279/128
[58] Field of Search .................................. 361/230–235; 279/128

[56] References Cited

U.S. PATENT DOCUMENTS

| | | | |
|---|---|---|---|
| 4,184,188 | 1/1980 | Briglia | 361/234 |
| 4,384,918 | 5/1983 | Abe | 156/643 |
| 4,399,016 | 8/1983 | Tsukada et al. | 204/192 R |
| 4,502,094 | 2/1985 | Lewin et al. | 361/234 |
| 4,652,411 | 3/1987 | Swarr et al. | 264/43 |
| 4,752,857 | 6/1988 | Khoury et al. | 361/231 |
| 4,771,730 | 9/1988 | Tezuka | 118/723 |
| 4,920,640 | 5/1990 | Enloe et al. | 29/852 |
| 5,117,121 | 5/1992 | Watanabe et al. | 361/234 |
| 5,151,845 | 9/1992 | Watanabe et al. | 361/234 |
| 5,155,652 | 10/1992 | Logan et al. | 361/234 |
| 5,207,437 | 5/1993 | Barnes et al. | 361/234 |
| 5,325,261 | 6/1994 | Horwitz | 361/234 |
| 5,384,681 | 1/1995 | Kitabayashi et al. | 361/234 |
| 5,384,682 | 1/1995 | Watanabe et al. | 361/234 |
| 5,459,632 | 10/1995 | Birang et al. | 361/234 |
| 5,473,008 | 12/1995 | Hessel et al. | 524/561 |
| 5,474,614 | 12/1995 | Robbins | 361/234 |
| 5,491,603 | 2/1996 | Birang et al. | 361/234 |
| 5,540,884 | 7/1996 | Chiao | 419/47 |
| 5,583,737 | 12/1996 | Collins et al. | 361/234 |
| 5,600,530 | 2/1997 | Smith | 361/234 |
| 5,612,850 | 3/1997 | Birang et al. | 361/234 |
| 5,646,814 | 7/1997 | Shamouilian et al. | 361/234 |
| 5,671,116 | 9/1997 | Husain | 361/234 |

FOREIGN PATENT DOCUMENTS 1-298721  12/1989  Japan.
2-27748   1/1990  Japan.

OTHER PUBLICATIONS

Klein, Allen J., "Curing Techniques for Composites," *Advanced Composites*, Mar./Apr. 1988, pp. 32–44.
"Data Sheet—Breathers and Bleeders," Data Sheet from Airtech International, Inc., Carson, California (1993).
IBM Technical Disclosure Bulletin, vol. 32, No. 5B, Oct. 1989, "Double Sided Electrostatic Chuck".
"Kapton General Information," Technical Brochure from DuPont de Nemours Company, Wilmington, Delaware (1993).
"R/flex® 1100 High Temperature Materials," Data Sheet DS20903D, Rogers Corporation, Chandler, Arizona (1993).
U.S. Patent Application entitled, "An Electrostatic Chuck Having a Grooved Surface"; filed Jul. 20, 1993; Serial No. 08/094,640; Inventor: Steger; Attorney Docket No. 260.
U.S. Patent Application entitled, "Protective Coating for Dielectric Material on Wafer Support Used in Integrated Circuit Processing Apparatus and Method of Forming Same," filed Apr. 22, 1993; Serial No. S/N 08/052,018; Inventors: Wu, et al.; Attorney Docket No. 428.

*Primary Examiner*—Fritz Fleming
*Attorney, Agent, or Firm*—Janah & Associates

[57] ABSTRACT

An electrostatic chuck 20 for holding a substrate 12 comprises a dielectric 70 having a receiving surface 75 for receiving the substrate thereon. The dielectric 70 comprises a charging electrode 80 for generating electrostatic charge for electrostatically holding the substrate 12 to the receiving surface 75, and a discharge electrode 85 electrically isolated from the charging electrode for removing electrostatic charge accumulated in the chuck 20.

32 Claims, 6 Drawing Sheets

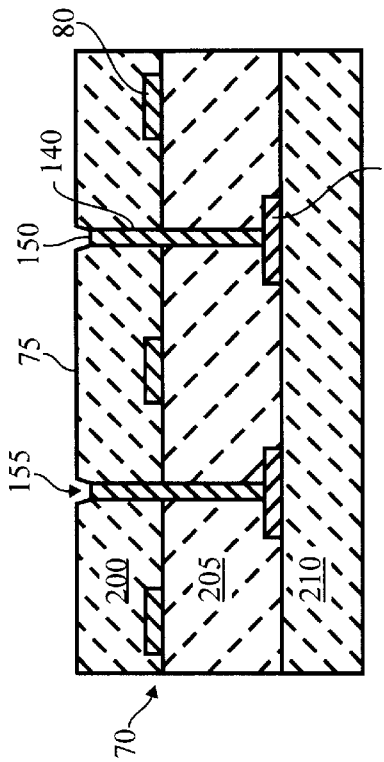
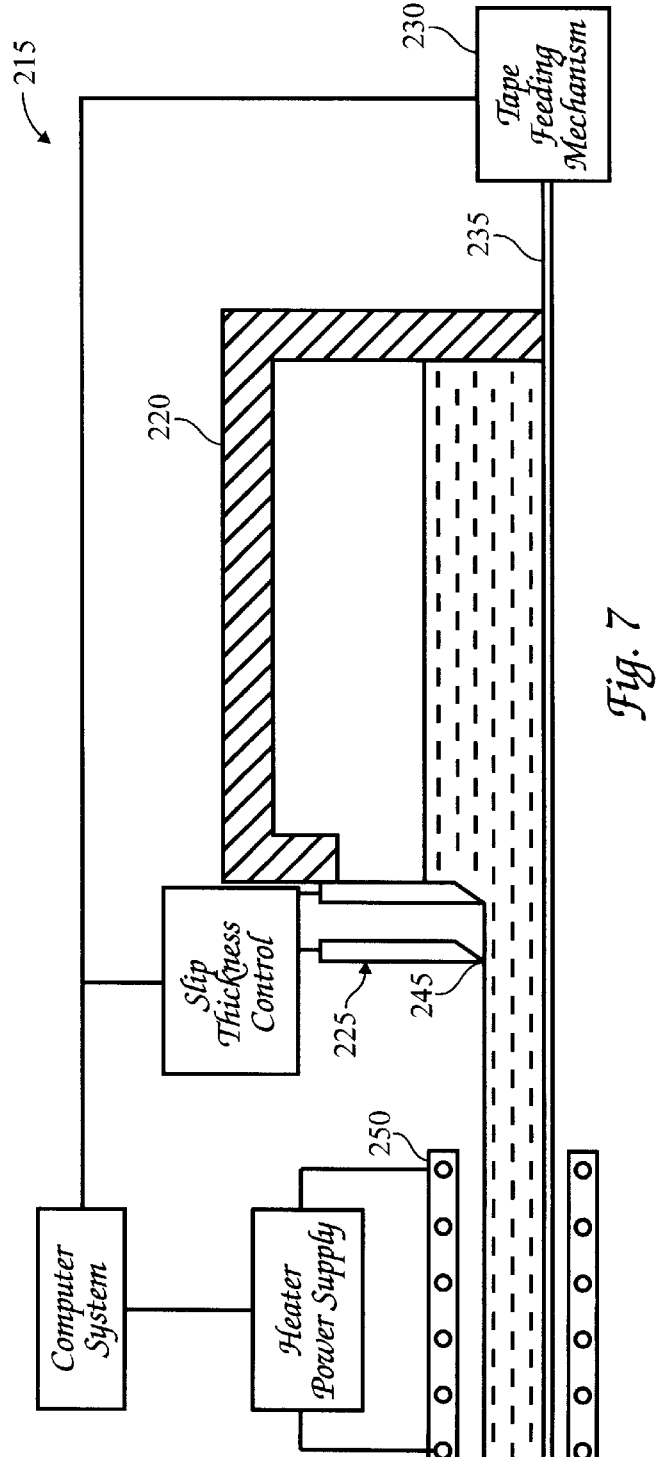

ELECTROSTATIC CHUCK CAPABLE OF RAPIDLY DECHUCKING A SUBSTRATE

BACKGROUND

The present invention relates to an electrostatic chuck useful for holding a substrate.

Electrostatic chucks are used to hold semiconductor silicon wafers during processing in a process chamber. A typical electrostatic chuck comprises an electrode covered by a dielectric layer. The electrode of the chuck is electrically biased with respect to the substrate by an applied voltage. Process gas is introduced into the process chamber, and in certain processes, an electrically charged plasma is formed from the process gas. In monopolar electrode chucks, the electrical voltage and plasma induce opposing electrostatic charge in the chuck and substrate that result in an attractive electrostatic force that electrostatically holds the substrate to the chuck. In bipolar electrode chucks, the bipolar electrodes are electrically biased relative to one another to provide an electrostatic force that holds the substrate to the chuck.

The electrostatic attractive force generated by electrostatic chucks 10a, 10b can be of two different types. As schematically illustrated in FIG. 1(a), a dielectric layer 11 with a high resistance provides Coulombic electrostatic forces that are generated by the accumulation of electrostatic charge in the substrate 12 and in the electrode 13 of the chuck 10a, causing polarization within the dielectric layer 11. The Coulombic electrostatic pressure is described by the equation:

$$\frac{F}{A} = \frac{1}{2} \epsilon_0 \left( \frac{V}{\frac{t}{\epsilon_r} + \delta} \right)^2$$

where $\epsilon_0$ and $\epsilon_r$ are the dielectric constant of vacuum and relative dielectric constant of the dielectric layer 11 respectively, V is the voltage applied to the electrode 13, t is the thickness of the dielectric layer, and $\delta$ denotes the contact resistance of an air gap between the substrate 12 and the dielectric layer 11. The electrostatic force increases as the relative dielectric constant $\epsilon_r$ of the dielectric layer 11 increases.

With reference to FIG. 1b, Johnsen-Rahbek or non-coulombic electrostatic attraction forces arise when an air gap interface 14 between a low resistance dielectric layer 15 and the substrate 12 has an interfacial contact resistance much greater than the resistance of the dielectric layer 15, i.e., when the resistance of the dielectric layer 15 is typically less than about $10^{14}$ $\Omega$ cm. In these chucks, electrostatic charge drifts through the dielectric layer 15 under the influence of the electric field and accumulates at the interface of the dielectric layer 15 and the substrate 12, as schematically illustrated in FIG. 1(b). The charge accumulated at the interface generates an electrostatic pressure represented by the equation:

$$\frac{F}{A} = \frac{1}{2} \epsilon_0 \left( \frac{V}{\delta} \right)^2$$

where $\delta$ denotes the contact resistance of the air gap between the substrate 12 and the low resistance dielectric layer 15. The Johnsen-Rahbek electrostatic attractive force is larger for a given applied voltage because polarization in the dielectric layer and free charges accumulated at the interface (which is at a small distance from the substrate) combine to enhance electrostatic force. A strong electrostatic force securely clamps the substrate 12 onto the chuck and improves thermal transfer rates. Also, it is desirable to operate the chuck using lower voltages to reduce charge-up damage to active devices on the substrate 12.

It is known to use ceramic formulations to fabricate the low resistance dielectric layers 15 to provide Johnsen-Rahbek electrostatic chucks. For example, Watanabe et al., disclose various formulations of $Al_2O_3$ doped with low levels of 1–3 wt % $TiO_2$ to form low resistance ceramic dielectric layers, in "Relationship between Electrical Resistivity and Electrostatic Force of Alumina Electrostatic Chuck," *Jpn. J. Appl. Phys.*, Vol. 32, Part 1, No. 2, 1993; and "Resistivity and Microstructure of Alumina Ceramics Added with $TiO_2$ Fired in Reducing Atmosphere," *J. of the Am. Cer. Soc. of Japan Intl. Edition*, Vol. 101, No. 10, pp. 1107–1114 (July 1993). In another example, U.S. Pat. No. 4,480,284 discloses a chuck having a ceramic dielectric layer made by flame spraying $Al_2O_3$, $TiO_2$, or $BaTiO_3$ over an electrode, and impregnating the pores of the ceramic dielectric with a polymer. Whereas pure $Al_2O_3$ ceramic layers have resistivities on the order of $1 \times 10^{14}$ ohm cm, the alumina/(1–3 wt % titania) ceramic formulations typically have resistivities on the order of $1 \times 10^{11}$ to $1 \times 10^{13}$ that provide Johnsen-Rahbek electrostatic forces.

However, one problem with such conventional ceramic dielectric layers, arises from their poor dechucking properties, which refer to the degree of difficulty of removing the substrate from the surface of the electrostatic chuck on completion of processing. The electrostatic charge which accumulates in the substrate and below the surface of the dielectric layer, does not dissipate even after the voltage applied to the electrode is turned off. For example, Nakasuji, et al., in "Low Voltage and High Speed Operating Electrostatic Wafer Chuck Using Sputtered Tantalum Oxide Membrane," *J. Vac. Sci. Technol. A*, 125(5), Sep/Oct 1994, describes an electrostatic chuck coated with $Al_2O_3$ doped with 1 wt % $TiO_2$, that takes from 20 to 120 seconds for the residual electrostatic charge to dissipate. As a result, the substrate cannot be removed from the chuck until the accumulated charge gradually dissipates. The time delay for charge dissipation provides unacceptably low processing throughput.

Various methods have been used to dissipate or neutralize the accumulated electrostatic charge, including (i) use of ionized gases to neutralize the charge, (ii) oscillating sinusoidal AC voltages to prevent formation of the electrostatic charge, or (iii) providing high transient currents at the transitions of the waveforms of the AC voltages applied to the electrode. However, these solutions require additional processing steps and can cause currents that damage active devices on the semiconductor substrate. Sinusoidal AC waveforms can result in resonance vibrations that damage monocrystalline silicon substrates and cause movement of the substrate during processing. Also, oscillating AC voltages remove the surface charge at a rate which typically results in about a 2-to-4 second dechucking release time. This is slow in relation to the required speed of the robotic handling devices that are used to pick-up and drop-off substrates onto the electrostatic chuck. Any residual force that remains due to incomplete discharge of the residual charge can cause the substrate to break or slide in unpredictable directions during pick-up or drop-off of the wafer by a robotic arm. One must either wait for the electrostatic clamping force to decay or apply a potentially damaging lifting force to remove the substrate.

Thus there is a need for an electrostatic chuck that provides quick charging and discharging response times, to allow rapid chucking and dechucking of the substrate held on the chuck. There is also a need for a discharging chuck that will not cause excessive leakage of electrostatic charge during operation of the chuck or dissipate the electrostatic holding force during processing of a substrate. It is further desirable for the electrostatic chuck to avoid discharging a surrounding plasma during processing of the substrate.

SUMMARY

The present invention relates to an electrostatic chuck that provides rapid chucking and dechucking of a substrate held on the chuck, without dissipating the electrostatic holding force, or discharging a surrounding plasma during plasma processing. The chuck comprises a dielectric member having a receiving surface for receiving the substrate thereon, and a charging electrode for generating electrostatic charge to electrostatically hold the substrate to the receiving surface. The chuck further comprises a discharge electrode electrically isolated from the charging electrode for rapidly discharging any residual electrostatic charge accumulated in the chuck during processing. In a preferred embodiment, the discharge electrode comprises conductor elements having exposed contact ends that terminate on the receiving surface and are electrically isolated from the substrate.

In another aspect, the invention is directed to a method of using the electrostatic chuck, in which, a substrate is placed on the receiving surface of the dielectric member, and a voltage is applied to the charging electrode to electrostatically hold the substrate. After processing is complete the voltage applied to the charging electrode is terminated, and an electrical potential is applied to the discharging electrode to remove or neutralize residual electrostatic charge in the chuck, and thereafter, the substrate can be rapidly dechucked and removed from the surface of the dielectric. The electrical potential applied to the discharge electrode can be electrical ground or can be an electrical potential that substantially opposes the potential of the residual charge remaining in the dielectric member to deplete the residual charge.

In yet another aspect, the invention is a method of fabricating an electrostatic chuck by forming at least two dielectric plates by tape casting and forming an electrical conductor layers on the dielectric plates. The dielectric plates are joined to one another so that the electrical conductor layer is enclosed by the dielectric plates. The assembly of dielectric plates and electrical conductor layers is sintered to form an electrostatic chuck. In a preferred method of fabrication, a first electrical conductor layer is formed on a first dielectric, and a second dielectric having holes therethrough is positioned over the first electrical conductor layer on the first dielectric. The holes in the second dielectric are filled with electrical conductor material to form one or more conductor elements that extend from the electrical conductor layer through the second dielectric. The conductor elements have exposed contact portions on the surface of the second dielectric.

DRAWINGS

These features, aspects, and advantages of the present invention will become better understood with regard to the following description, appended claims, and accompanying drawings which illustrate versions of the invention, where:

FIGS. 6a and 6b are schematic side views of successive fabrication steps showing the dielectric and electrically conducting layers of the electrostatic chuck; and FIG. 7 is a schematic view of a tape casting apparatus suitable for fabricating an electrostatic chuck according to the present invention.

DESCRIPTION

Figure 1B:
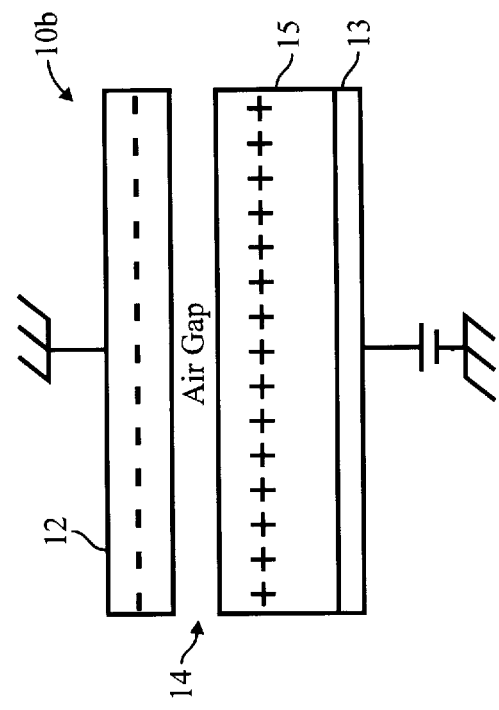
FIG. 1b (Prior Art) is a schematic view of an electrostatic chuck that operates by Johnsen-Rahbek electrostatic forces.
Figure 1A:
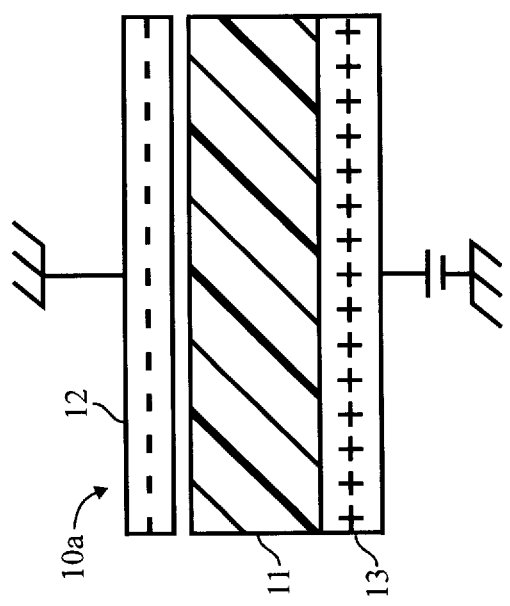
FIG. 1a (Prior Art) is a schematic view of an electrostatic chuck that operates by Coulombic electrostatic forces.
Figure 2:
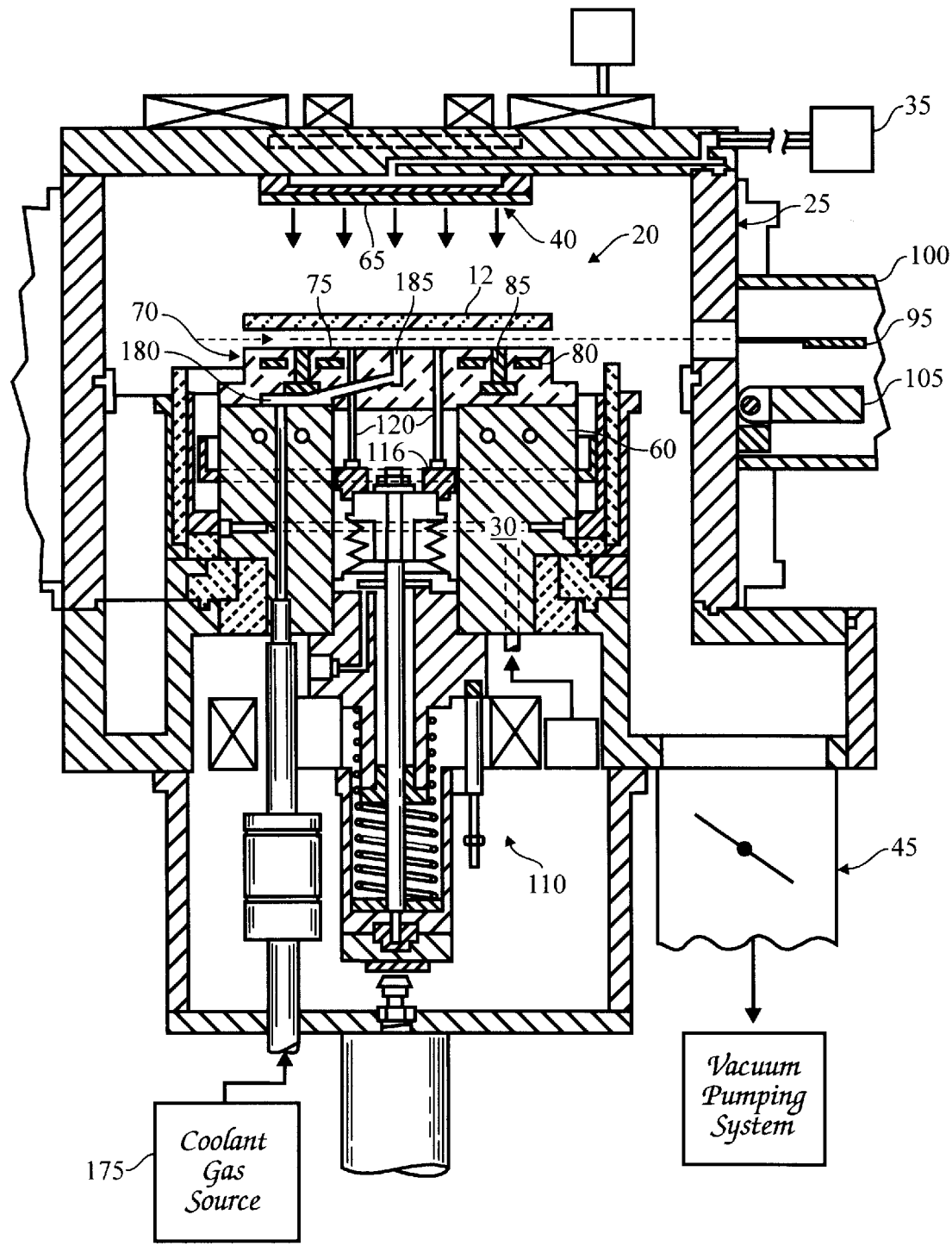
FIG. 2 is a schematic sectional side view of a process chamber comprising a version of the electrostatic chuck according to the present invention.
Figure 4:
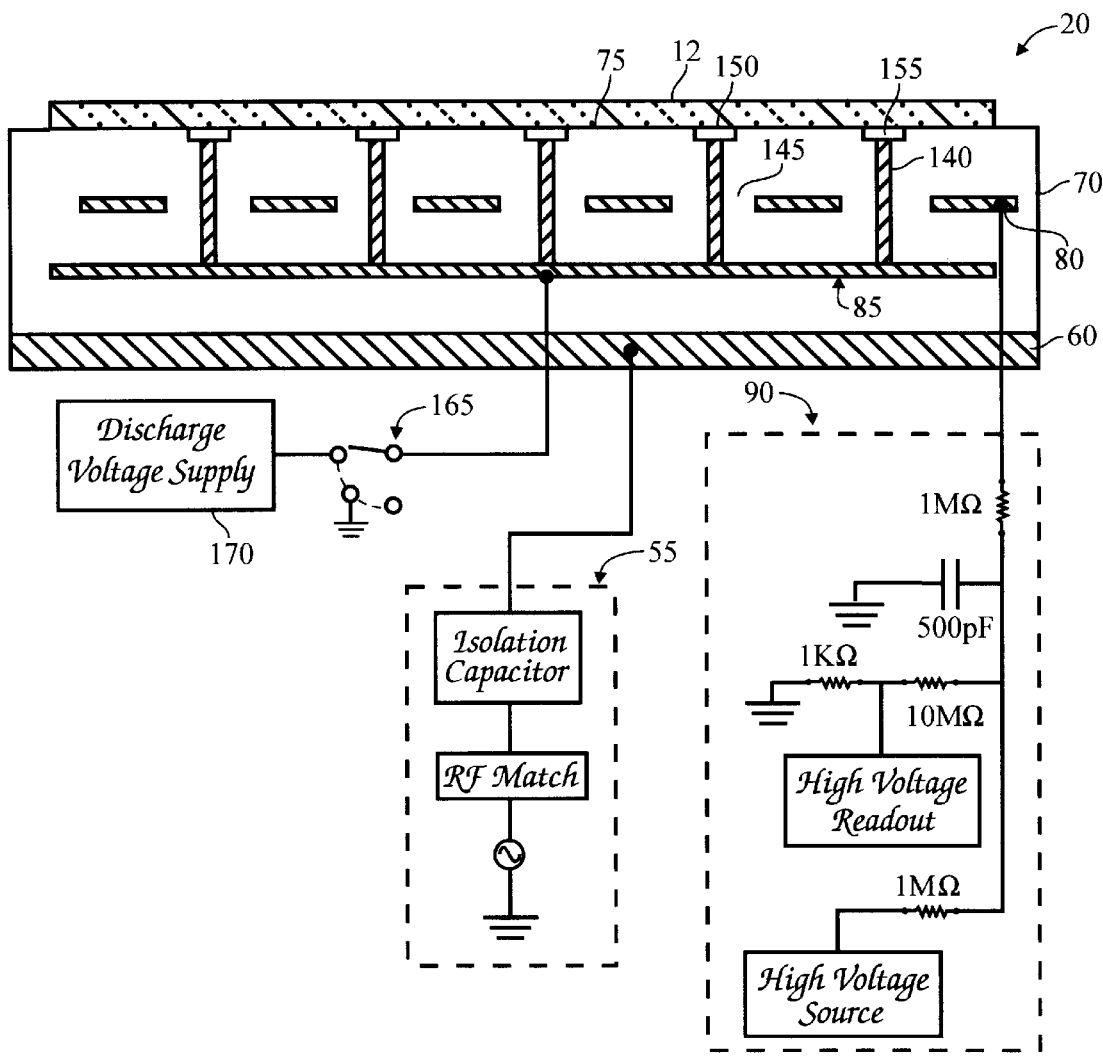
FIG. 4 is a schematic side view of another version of the electrostatic chuck showing the conducting elements of the discharge electrode electrically isolated from the charging electrode, and having contact ends terminating in recessed portions of the dielectric surface.

The present invention relates to an electrostatic chuck 20 that provides rapid chucking and dechucking of an electrostatically held substrate 12, without excessive leakage of electrostatic charge during operation of the chuck in a semiconductor process chamber, such as a physical or chemical vapor deposition apparatus or an etching apparatus. FIG. 2 illustrates an exemplary magnetically enhanced plasma etching apparatus such as the "PRECISION 5000", commercially available from Applied Materials, Inc., Santa Clara, Calif. The apparatus illustrates the present invention; however, the present invention can be used in other apparati as apparent to one of ordinary skill. The electrostatic chuck 20 is secured on a base 30 in a process chamber 25 that forms an enclosure for processing of the substrate 12. The process chamber 25 typically includes a process gas source 35 for introducing process gas into the chamber via a gas distributor 40, and a throttled exhaust 45 for controlling process pressure and exhausting gaseous byproducts from the chamber. As illustrated in FIG. 4, the process gas is ionized to form a plasma using a plasma generator that couples RF power supplied by a RF voltage source 55 to the chamber, which can be an inductor coil that generates an induction field in the chamber and/or a cathode 60 and an anode 65 electrodes that generate a capacitive electric field in the process chamber 25. The frequency of the RF voltage applied to the process electrodes 60, 65 is typically from about 50 Khz to about 60 MHZ, and more typically about 13.56 MHZ; and the RF power is typically from about 100 to about 5000 Watts.

As schematically illustrated in FIG. 4, the chuck 20 comprises a dielectric member 70 having a receiving surface 75 for receiving a substrate 12 thereon. A charging electrode 80 is embedded in the dielectric member 70 for generating an electrostatic charge to electrostatically hold the substrate 12 to the chuck 20. A discharge electrode 85 electrically isolated from the charging electrode 75 is also embedded in the dielectric member 70 for dissipating the charge accumulated in the chuck 20 to allow dechucking of the substrate 12. On application of a voltage to the charging electrode 80 by a voltage supply 90 electrostatic charge rapidly accumulates in the electrode 80 and/or leaks from the electrode 80 to accumulate at the interface between the dielectric member 70 and the overlying substrate 12, depending on the electrical resistance of the dielectric member 70. Charge accumulated in the charging electrode 80 typically generates Coulombic type electrostatic attraction, while charge accumulated at the receiving surface 75 or the dielectric member 70 generates Johnsen-Rahbek electrostatic attraction. These electrostatic forces securely hold the substrate 12 to the receiving surface 75 of the dielectric member. After the chucking process is completed, the chucking voltage is terminated and the charging electrode 80 is grounded to remove residual charge remaining in the electrode. Thereafter, the discharge electrode 85 is electrically grounded or an electrical potential is applied to remove or neutralize any residual electrostatic charge in the chuck. The substrate 12 is then removed from the surface 75 of the dielectric member 70.

To operate the chuck 20, the process chamber 25 is evacuated and maintained at a sub-atmospheric pressure. A robot arm 95 transports a substrate 12 from a load-lock transfer station 100 into the chamber 25 via a loading inlet 105 and places the substrate on a lift pin assembly 110 in the process chamber. The lift pin assembly 110 then lowers the substrate 12 onto the receiving surface 75 of the chuck 20. A suitable lift pin assembly 110 comprises a support 115 with a plurality of lift pins 120 mounted around the support. Preferably, at least three, and more preferably four lift pins 120 are mounted symmetrically on the support 115 so that the substrate 12 can be lifted off the chuck 20 by a uniformly applied pressure. The support 115 is attached to a lift bellows that can lift and lower the support 115 and lift pins 120 through the holes in the chuck 20 to lift and lower the substrate 12 off the chuck.

Figure 3A:
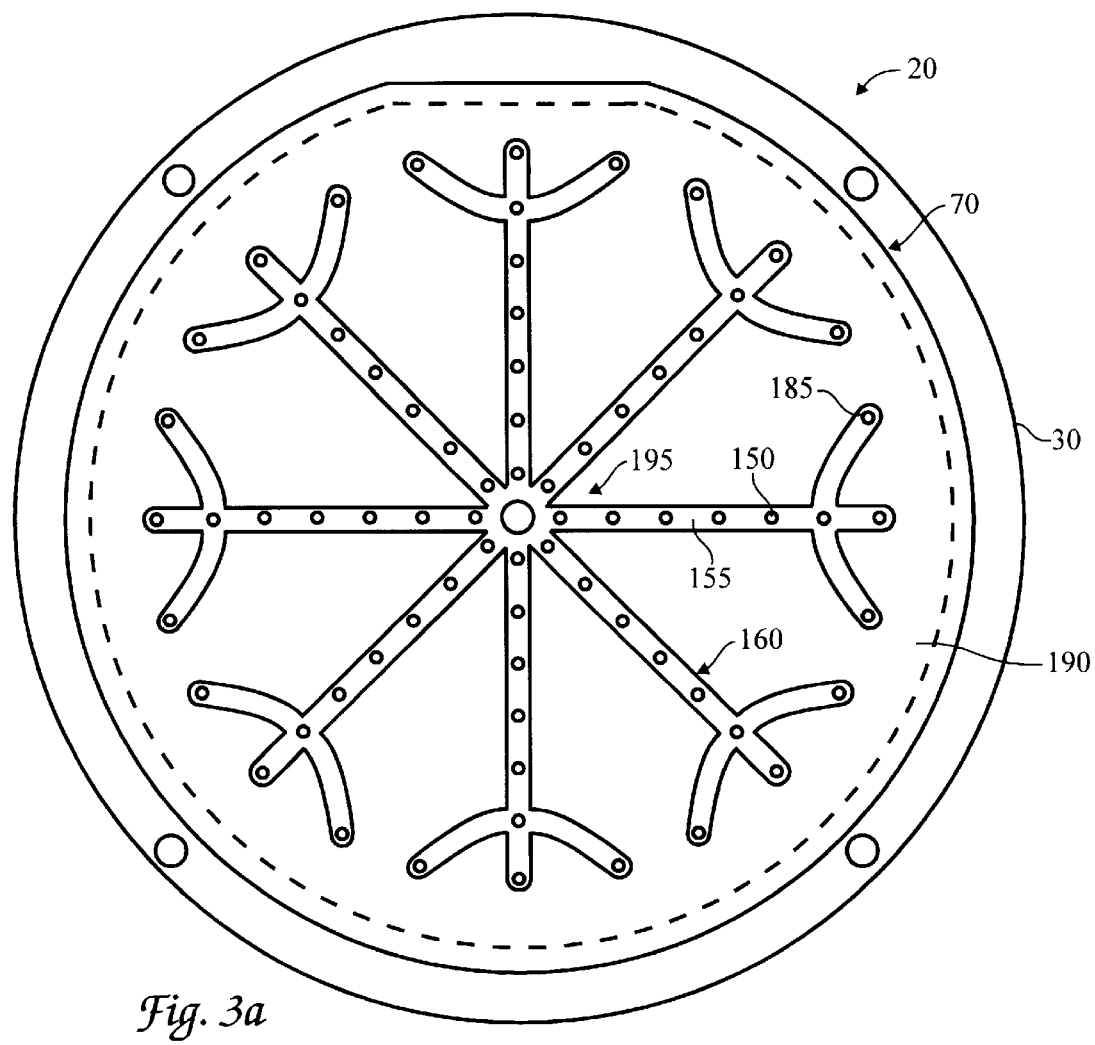
FIG. 3a is a schematic top view of another version of the electrostatic chuck comprising electrically isolated discharge electrodes and gas flow grooves.
Figure 3B:
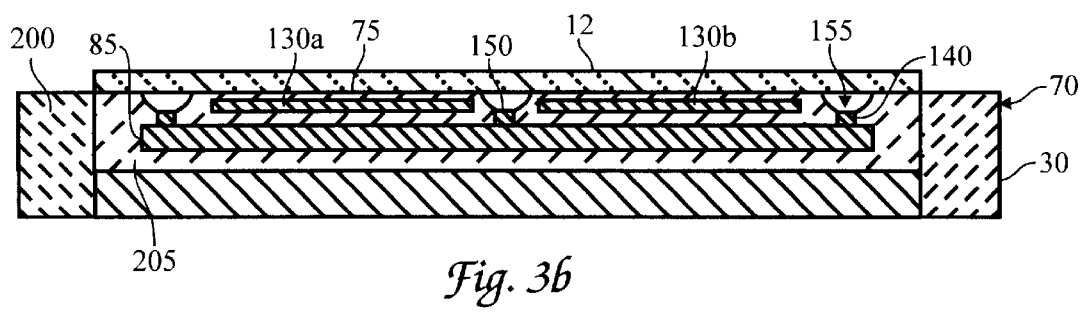
FIG. 3b is a schematic side view of another version of the electrostatic chuck showing a bipolar electrode structure.

The charging electrode 80 is electrically biased with respect to the substrate 12 by the voltage supply 90. The charging electrode 80 can comprise a monopolar electrode, as shown in FIG. 4, or a bipolar electrode as shown in FIG. 3b. During operation of the chuck 20 electrostatic charge accumulates in the electrode 80 and/or near the receiving surface 75 of the dielectric member 70 and the overlying substrate 12. For monopolar electrode chucks, the plasma in the chamber 25 comprises electrically charged plasma species which act as charge carriers allowing charges having opposite polarity to accumulate in the substrate 12. The opposing accumulated charges results in Coulombic and/or Johnsen-Rahbek electrostatic attractive forces which hold the substrate 12 to the chuck 20. In bipolar electrode chucks, as shown in FIG. 3b, the electrostatic chuck 20 has two or more electrically isolated electrode segments 130a, b to which different electrical potentials are applied. The difference in electric potential applied to each electrode segments 130a, b induces opposing electrostatic charges in the elements causing the substrate 12 to be electrostatically held to the chuck 20. Bipolar electrode configurations are advantageous for non-plasma processes in which there are no charged plasma species to serve as charge carriers for electrically biasing the substrate 12.

Optionally, the voltage supply 90 for the chuck 20 can apply both (i) a DC voltage to electrostatically hold the substrate 12, and (ii) an RF voltage to operate the charging electrode 80 as the cathode 60. In this embodiment, both the charging electrode 80 and cathode 60 are formed by the same structure. The DC voltage is typically from about 100 to about 1000 volts DC to generate an electrostatic charge that electrostatically holds the substrate 12 to the dielectric member 70. The RF voltage provides RF energy to the charging electrode 80 to generate an electric field that extends transversely through the substrate 12 and energizes the plasma above the substrate. The RF frequency of the voltage applied to the charging electrode 80 is applied through a fixed match network with a harmonic isolation filter. Match network components are selected to approximately match the impedance of the RF voltage module to the load impedance of the electrode in a selected frequency range. To tune the RF voltage, the RF frequency is varied within a selected range of frequencies to find the minium reflected power. With a fixed network (source or bias) this results in a near-resonance condition but not necessarily zero reflected power. Both control loops iterate to maintain a constant delivered power level to the electrode.

After completion of the semiconductor fabrication process, the residual electrical charges in the chuck 20 is dissipated to electrostatically decouple the substrate 12 from the chuck before it can be removed by the robotic transfer arm 95. In conventional electrostatic chucks, this is accomplished by turning off the voltage supply 90 and electrically grounding both the charging electrode 80 and the substrate 12 to remove the accumulated charges. One means of electrically grounding the substrate 12 is to maintain the plasma at a reduced power level to provide an electrically conductive path from the substrate to the grounded walls of the chamber 25. However, the resistivity or low conductance of the dielectric member 70 impedes the dissipation of the electrostatic charges accumulated on the receiving surface 75 and as a result the substrate 12 can continue to be strongly held to the chuck 20 by electrostatic attraction forces.

In an electrostatic chuck 20 according to the present invention, the discharge electrode 85 is used to remove or neutralize any accumulated residual electrostatic charge in the dielectric member 70. Referring to FIG. 4, the discharge electrode 85 comprises conductor elements 140 embedded in the dielectric member 70 that extend through the apertures 145 in the charging electrode and are electrically isolated from the charging electrode 80. The conductor elements 140 can be shaped as pins or fingers that extend between segments or through apertures 145 of the charging electrode 80 and which are electrically isolated from the charging electrode. The conductor elements electrically connect the discharge electrode 85 to the receiving surface 75. This arrangement allows the discharge electrode 85 to be located below the plane of the charging electrode 80 so that the discharge electrode does not block or absorb the electric field generated by charge in the charging electrode 80. The conductor elements should be positioned close to the region of charge accumulation to allow rapid depletion or neutralization of the residual charge.

More preferably, the conductor elements 140 define exposed contact ends 150 that terminate at the surface 75 of the dielectric member 70 to provide an electrical pathway for rapidly discharging electrostatic charge accumulated at the surface of the dielectric. The exposed contact ends of the discharge electrode 85 near the charge accumulation region provide surface charge dissipation pathways having a short length and a low resistance to rapidly dissipate or neutralize any residual electrostatic charges accumulated on the dielectric receiving surface 75. The surfaces of the exposed contact ends 150 are generally flush, or form a continuous surface, with the receiving surface 75 to maximize surface conduction. The individual contact ends 150 exposed on the receiving surface generally have a diameter of about 0.13 to about 0.26 mm (0.005 to 0.01 inches) and an area of from about 0.01 mm$^2$ to about 0.05 mm$^2$. Preferably, the total area of all exposed contacts ends for the receiving surfaces is from about 0.1 mm$^2$ to about 50 mm$^2$. Generally, the dielectric member comprises a more highly conductive receiving surface 75, because of the charged chemical groups present on the surface. For example, the surface of silicon dioxide ceramic dielectrics often comprises silanol groups (SiOH⁻) that provide higher surface charge conductance. For this reason, the exposed contact surfaces can occupy a smaller area than the entire surface area of the receiving surface 75 and still provide a rapid electrostatic charge transport pathway. The contact ends 150 are electrically isolated from the plasma by the overlying substrate 12. For an electrostatic chuck 20 used with an 8 inch (200 mm) silicon wafer, a suitable number of contact ends 150 ranges from about 10 to about 1,000. Typically the contact ends 150 are distributed equidistant from one another in a uniform manner around the central portion 195 of the receiving surface 75 which is covered by the substrate 12 during operation. The spacing between the contact ends 150 is typically from about 0.5 to about 10 mm, and more preferably from about 2 to about 5 mm.

Preferably, the exposed contact ends 150 of the conductor elements are electrically isolated from the substrate 12 by positioning the contact ends in recessed portions 155 in the receiving surface 75 of the dielectric 70. This reduces or prevents charge leakage from the substrate to the contact ends. More preferably, as illustrated in FIG. 3a, the recessed portions 155 of the dielectric 70 comprise grooves 160 that are used to hold a heat transfer fluid for regulating the temperature of the substrate 12 held on the chuck 20. The contact ends 150 terminate in the lower surface of the grooves 160 and are spaced apart uniformly along the axis of the longitudinal grooves. In a further refinement, not shown, a thin layer of metal can be deposited on the lower surface of the grooves 160 to increase the effective surface area of the contact ends 150 of the discharge electrode 85 close to the electrostatic charges accumulated on the receiving surface 75 to further increase the rate at which residual electrostatic charges are dissipated or neutralized.

A switching circuit 165 electrically connected to the discharge electrode 85 comprises a switch for connecting the electrode to electrical ground or for supplying a voltage or opposing electrical potential that depletes or neutralizes the residual electrostatic charge on the substrate 12. For example, a potential having negative polarity is applied to the discharge electrode when the accumulated electrostatic charge has a positive polarity. Conversely, a positive polarity potential is applied to the discharge electrode when the accumulated electrostatic charge has a negative polarity. By opposing polarity it is meant a potential that is sufficiently low or high to deplete or neutralize the residual charge. Preferably, the switching circuit 165 comprises a single pole, three position switch that selectively electrically connects the discharge electrode to electrical ground, a dechucking voltage source 170 to accelerate dissipation of the accumulated charge, or a third "floating" position to which no potential is applied. The switching circuit 165 can be operated manually by the operator or automatically by a computer control system that provides feedback from the substrate transport mechanism.

Preferably, as shown in FIG. 2, the chuck 20 further comprises a system for regulating the temperature of the substrate 12 held on the chuck 20. A coolant gas source 175 can be used to supply a heat transfer gas such as helium to grooves 160 in the receiving surface 75 of the dielectric member 70 through gas supply channels 180 and openings 185. The heat transfer gas in the grooves 160 can be used to heat or cool the substrate to regulate the temperature of the substrate 12 and maintain constant temperatures during processing. Typically, the grooves 160 form an intersecting pattern extending across the receiving surface 75 of the dielectric from a peripheral edge 190 to the center edge 195. The heat transfer gas is contained in the grooves 160 by the overlying substrate 12, and is typically supplied at a pressure of about 1 to 10 Torr. Preferably, at least some of the openings 185 terminate at the peripheral edge of the chuck 20 to cool the peripheral edge of the substrate 12 that tends to overheat during processing.

Particular features of the electrostatic chuck 20 and their method of fabrication will now be described. The dielectric member 70 of the electrostatic chuck 20 comprises either a doped or undoped ceramic material. Suitable materials for fabricating the dielectric member 70 include aluminum oxide, aluminum nitride, boron carbide, boron nitride, diamond, silicon oxide, silicon carbide, silicon nitride, titanium oxide, titanium carbide, yttrium oxide, zirconium boride, zirconium carbide, zirconium oxide, and equivalents or mixtures thereof. Preferably the dielectric member 70 comprises a material having a sufficiently low resistance to provide non-coulombic Johnsen-Rahbek electrostatic pressure to hold the substrate when a voltage is applied to the charging electrode. A suitable low resistance or semiconducting material is preferably sufficiently leaky to allow the voltage applied to the charging electrode 80 to rapidly accumulate at the interface between the receiving surface 75 and the substrate 12. The dielectric breakdown strength of the semiconducting material is preferably from about 1 to 100 volts/microns, and the resistance is preferably between about $10^8$ to $10^{16}$ Ω cm.

A semiconducting dielectric member 70 can be fabricated from a composition comprising alumina ($Al_2O_3$) doped with (i) transition metal oxides, such as for example, $TiO_2$, $Cr_2O_3$, $MnO_2$, CoO, CuO, and mixtures thereof; (ii) alkaline earth metals or oxides, such as for example, Ca, Mg, Sr, Ba, CaO, MgO, SrO, or BaO; or (iii) a combined oxide formulation, such as for example, $CaTiO_3$, $MgTiO_3$, $SrTiO_3$, and $BaTiO_3$. Whereas, pure aluminum oxide has a resistivity of $10^{14}$ Ω cm and a charging/discharging response time of about $10^3$ seconds; the highly doped alumina of the present invention has a resistivity typically ranging from about $5 \times 10^9$ Ω cm to about $8 \times 10^{10}$ Ω cm, and provides a charge accumulation response time of about 1 second. Also, unlike conventional ceramic formulations, the resistivity of the highly doped alumina does not appear to change in a wide range of temperatures of −10° C. to 100° C. The semiconducting material preferably has a high thermal conductivity to dissipate heat generated in the substrate 12 during processing, a suitable thermal conductivity being at least about 10 Watts/m/K. The thickness selected for a layer of semiconductor material covering the charging electrode 80 depends on the electrical resistivity and dielectric constant of the material. For example, when the semiconducting material has a dielectric breakdown strength of about 10 volts/microns, a suitable thickness is from about 10 $\mu$m to about 500 $\mu$m, and more typically from about 100 $\mu$m to about 300 $\mu$m. Preferably, the dielectric member 70 comprises a unitary body formed by multiple layers of semiconductor or insulating material enclosing the electrodes 80, 85, each semiconductor layer typically has a thickness of from about 50 $\mu$m to about 200 $\mu$m.

The dielectric member 70 can also comprise a composite of multiple layers including a first layer 200 having semiconducting electrical properties, and a second layer 205 having dielectric properties, as shown in FIGS. 3b, 6a, and 6b. The properties of the first and second layers 200, 205 can also be tailored to achieve different electrical properties at different portions of the chuck 20. For example, as shown in FIG. 3b, the first layer 200 can comprise a material covering the peripheral edge of the chuck 20 and having a first dielectric breakdown strength, while the second layer 205 comprises a material having a different dielectric breakdown strength covers the center 195. Preferably, the dielectric breakdown strength of first layer is higher than that of the second dielectric to prevent plasma discharge at the peripheral edge of the chuck 190. Alternatively, the resistivity of the second dielectric layer 205 can be sufficiently high to prevent electrical discharge or arcing between the surrounding plasma environment and the peripheral portions of the charging electrode 80. In another embodiment, the dielectric member 70 can comprise a composite of multiple vertically stacked layers, as shown in FIGS. 6a and 6b. The multilayer structure is tailored to provide increased electrostatic charge retention at the receiving surface 75, and/or faster electrostatic charge accumulation and dissipation response times through the body of the dielectric member 70. This can be accomplished by forming the first dielectric layer 200 from a material having a lower resistivity over the higher resistivity second dielectric layer 205. Because the electrostatic attraction force is largely attributable to the charge concentrated near the receiving surface 75 of the dielectric member 70, such a multilayer composite dielectric, can provide excellent surface charge retention characteristics, without affecting charge dissipation from the underlying layers. The multiple layers can also be selected to have different dielectric constants, hardness, or leakage characteristics. For example, as shown in FIG. 6a the composite dielectric layer can comprise two layers such as $SiO_2$, or certain aluminasilicates. In another embodiment the composite dielectric layer can comprise a third layer 210 as shown in FIG. 6b. This configuration is particularly useful where the charging electrode 80 and the discharge electrode 85 are not formed on the same plane.

The charging electrode 80 and the discharge electrode 85 can be fabricated from a metal such as copper, nickel, aluminum, molybdenum, or combinations thereof. The charging electrode 80 is covered on both sides by the dielectric member 70. The charging electrode 80 typically comprises discrete metal conductor elements, or a continuous layer of metal having apertures 145 therethrough. Typically, the thickness of the charging electrode 80 is from about 1 $\mu$m to about 100 $\mu$m, and more typically from 1 $\mu$m to 50 $\mu$m. Preferably, the charging electrode 80 comprises an area nearly the same as the substrate 12. For a substrate 12 having a diameter of 200 to 300 mm (6 to 8 inches), the charging electrode 80 typically comprises an area of about 290 to about 650 sq. cm. The bipolar electrodes shown in FIG. 3b comprise two separate sets of conducting segments 130a, 130b substantially coplanar to one another, and to which different electrical potentials are applied. The bipolar electrode conducting segments 130a, 130b can form opposing semicircles, or alternating electrodes, with electrical isolation voids therebetween to electrically isolate the electrodes from one another. In one advantageous configuration, the electrical isolation voids are sized and configured to serve as the grooves 160 for holding the heat transfer gas.

Figure 5A:
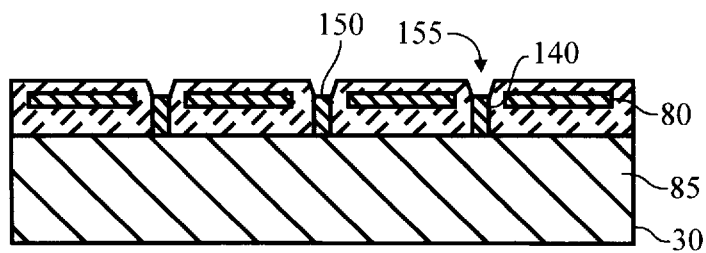
FIG. 5a is a schematic side view of another version of the electrostatic chuck in which an electrically conducting base serves as the discharge electrode.
Figure 5B:
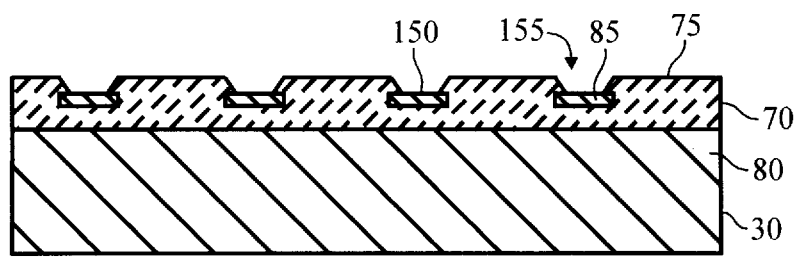
FIG. 5b is a schematic side view another version of the electrostatic chuck in which an electrically conducting base serves as the charging electrode.

The dielectric member 70, with the charging 80 and discharge electrodes 85 embedded therein, is fixed to and supported by the base 30. Optionally, as shown in FIGS. 5a and 5b, the base itself can serve as one of the electrodes 80, 85. FIG. 5a illustrates an electrostatic chuck 20 in which the charging electrode 80 embedded in the dielectric member 70 is attached to the base 30, which comprises conductor elements 140 that serves as the discharge electrode 85. FIG. 5b illustrates an electrostatic chuck 20 in which the discharge electrode 85 is embedded in the dielectric member 70, and the base 30 serves as the charging electrode 80. In either version, the base 30 is shaped and sized to correspond to the shape and size of the substrate 12 to maximize heat transfer and provide a large electrostatic holding surface for the chuck 20. For example, if the substrate 12 is disk shaped, a right cylindrically shaped base 30 is preferred. Typically, the base 30 comprises an aluminum cylinder having a diameter of about 100 mm to 225 mm, and a thickness of about 1.5 cm to 2 cm.

The electrostatic chuck of the present invention can be fabricated by a variety of conventional methods, as apparent to those skilled in the art, including for example, tape casting, self-adhesive laminates, thermal spraying, or sintering a ceramic block with the electrodes embedded therein. For example, U.S. patent application Ser. No. 08/381,786, titled ELECTROSTATIC CHUCK WITH CONFORMAL INSULATOR FILM to Shamouilian et al., which is incorporated herein by reference, describes methods of fabricating a dielectric member and electrodes of an electrostatic chuck.

A preferred method of forming the dielectric member 70 comprises a tape casting method performed in an apparatus 215 that is schematically illustrated by FIG. 7, to cast ceramic dielectric plates which are used to form the dielectric member 70. The tape casting apparatus 215 comprises a slurry tank 220, one or more thickness control blades 225, and a tape feeding assembly 230 for feeding a thin polymeric film 235 below the slurry tank. A tape casting slip is fed in a controlled thickness onto the polymeric film 235 using the blades 225. The tape casting slip comprises a mixture of finely sized ceramic particles suspended in a solvent and a binding agent. The ceramic powder has a fine particle size distribution, high surface area, and low impurity level. Conventional milling techniques, such as ball milling, are used to grind the ceramic powder to obtain a relatively uniform particle size distribution. The milled material is placed in an air tight container and de-aired using a vacuum pump and mixed with the solvent. Highly volatile solvents, such as acetone, provide thin tape cast films, while lower volatility solvents such as toulene, produce thicker films. An organic binder is added to the tape casting slip to form a tough flexible tape cast film on drying. A suitable plasticizer, e.g., polyethylene glycol or octyl phthalate can also be added to increase the flexibility and ease of handling of the tape cast film. The ratio of ceramic powder to solvent to binder in the slip is selected so that the dried tape cast film does not leave excessive carbon or ash residue during firing and is relatively unaffected by ambient atmospheric conditions, such as temperature and humidity.

The slip is transferred to the slurry tank 220 of the tape casting apparatus 215. The slurry tank 220 comprises a sluice valve consisting of thickness control blades 225 through which the slip is allowed to flow out over the polymeric film 235. The blades 225 have wedge shaped tips 245 that are raised or lowered to control the gap between the film 235 and the tips, thereby controlling the thickness of the dielectric plates. Preferably, at least two spreading blades 225 are positioned in series. The tip 245 of each blade 225 comprises a sharp linear edge straight from about 0.1 to about 0.5 mil, that is positioned parallel with the surface of the polymeric film 235 to provide a uniform thickness across the width of the tape cast film. The polymer film 235 is roller fed from the roller tape feeding assembly 230 onto a smooth aluminum metal plate. As the polymeric film 235 moves below the sluice-valve 240 of the slurry tank 220, a controlled amount of slip is released to cover the polymeric film 235. The spreading blades 225 can be adjusted to obtain the desired thickness of the tape cast film down to about 25 microns (1 mil). The tape cast film is then dried using conventional heaters 250 to form thin flat ceramic plates of large surface area with thickness in the range of 50 mils to 1 mil. The dielectric member 70 is formed by cutting at least two plates from the tape cast film, joining the plates together to surround the screen printed charging electrode, and provide exposed contact portions of the discharging electrode. This assembly is sintered at temperatures greater than 100° C. to form the electrostatic chuck 20.

The holes for the conductor elements 140 of the discharge electrode 85 and the openings 185 for the heat transfer gas, are formed in the dielectric member 70 prior to sintering using laser micro-machining, a grinding wheel, or diamond/cubic boron nitride drilling. The number of openings 185 for supplying the heat transfer gas depends on the magnitude of the heat load and the heat transfer gas flow rate required to handle this load. For an electrostatic chuck 20 used to hold a 200 mm (8") silicon wafer, a suitable number of openings ranges from about 150 to about 300. Typically the openings 185 are in a ring-shape configuration around the peripheral edge 190 of the electrostatic chuck 20. The diameter of the opening 185 is about 2 mm (0.080 inches). More preferably the openings 185 are about 0.175±0.025 mm (0.007±0.001 inch).

Methods of forming the charging and discharge electrodes 80, 85 and their associated interconnecting conductors will now be described. The electrodes 80, 85 can be formed by depositing a thin layer of a conductive material on a dielectric layer by a variety of methods, for example, sputtering, CVD, or electroplating can be used to deposit a layer of electrical conductor material on a first dielectric layer. Thereafter, conventional photolithographic and etching methods, such as those described in *Silicon Processing for the VLSI Era, Volume* 1: *Process Technology*, Chapters 12, 13, and 14, by Stanley Wolf and Richard N. Tauber, Lattice Press, California (1986), which is incorporated herein by reference, can be used to form a patterned layer corresponding to the desired configuration of the charging and discharge electrodes 80, 85.

A preferred method of forming the electrodes 80, 85 comprises using an electrically conductive ink to form a pattern corresponding to the desired configuration of the electrodes on a first unsintered dielectric layer, such as one of the dielectric layers fabricated by tape casting. The electrically conductive ink comprises conducting powder, liquid carrier, and binder. Preferably, the conducting powder comprises tungsten, molybdenum, copper, silver, or gold. The liquid carrier can comprise water or an evaporative solvent such as methyl or ethyl alcohol. The binder comprises thermosetting binder selected from the group consisting of epoxide, polyester, urethane, and combinations thereof. The ratio of the conductive ink to binder is typically from about 5 to about 15% by weight. The liquid carrier and binder burn-off when the ceramic dielectric member 70 is sintered so that only the conducting powder remains to form the electrodes 80, 85 within the dielectric member, typical sintering temperatures being at least about 600° C., and more typically at least 1000° C. The conductor elements 140 of the discharge electrode 85 can also be formed using the conductive ink, by filling holes in a second dielectric layer placed over a first dielectric layer with conductive ink prior to sintering of the assembly of dielectric layers. Advantageously, the conducting ink allows fabrication of thin and narrow columnar shaped conductor elements that extend through the dielectric layers.

The charging electrode 80 and discharge electrode 85 can be formed as separate, co-planar, electrically isolated circuits on a single surface of the dielectric layers as shown in FIG. 6a, or on separate surfaces of the dielectric layers, as shown in FIG. 6b. One or more of the dielectric layers 205 have holes for the conductor elements 140 of the discharge electrode 85. In the second version, as shown in FIG. 6b, the composite dielectric member 70 comprises three layers, with the charging electrode 80 formed on the top surface of one of the dielectric layers 205, the discharge electrode 85 embedded between the other dielectric layers with holes for the conductor elements 140 of the discharge electrode passing through the dielectric layers 200, 205. For example, a first electrical conductor layer can be formed on a first dielectric layer 210, and a second dielectric layer 205 having holes therethrough is positioned over the conductor layer of the first dielectric layer 210. Both the first and second dielectrics comprise dielectric plates formed by tape casting a dielectric sheet and cutting the sheet to the requisite dielectric plate sizes. The holes in the second dielectric layer 205 are filled with electrical conductor material to form one or more conductor elements that extend from the electrical conductor layer through the second dielectric layer 205 and that have exposed contact portions on the surface of the second dielectric 205. The first electrical conductor layer 210 and the electrically connected conductor elements serve as the discharge electrode in the chuck. The second dielectric layer 205 comprises a second electrical conductor layer and holes that extend through the second electrical conductor layer. The second electrical conductor layer serves as the charging electrode and is embedded in the second dielectric 205 or is formed between the second dielectric layer 205 and a third dielectric layer 200 is positioned over the second dielectric layer. In this manner, the electrostatic chuck 20 of the present invention that comprises multiple dielectric layers with one or more electrodes embedded therebetween, is formed by the tape casting process.

Although the present invention has been described in considerable detail with regard to the preferred version thereof, other versions are possible. For example, the discharge electrode 85 can be fabricated in many other shapes and forms that are equivalent in function to the illustrative structures herein. Also, the dielectric layer 200 can be fabricated from equivalent compositions that provide quick chucking and dechucking response times. Therefore, the appended claims should not be limited to the description of the preferred versions contained herein.

What is claimed is:

1. An electrostatic chuck for holding a substrate, the chuck comprising a dielectric having a receiving surface for receiving the substrate thereon, and the dielectric comprising:

(a) a charging electrode for generating electrostatic charge for electrostatically holding the substrate to the receiving surface; and (b) a discharge electrode electrically isolated from the charging electrode for removing electrostatic charge accumulated in the chuck.

2. The electrostatic chuck of claim 1 wherein the discharge electrode comprises exposed contact ends that terminate on the receiving surface and are electrically isolated from the substrate.

3. The electrostatic chuck of claim 2 wherein the charging electrode comprises apertures, and wherein the discharge electrode comprises conductor elements that extend through the apertures and are electrically isolated from the charging electrode, the conductor elements terminating in the exposed contact ends.

4. The electrostatic chuck of claim 2 wherein the exposed contact ends terminate in recessed portions in the receiving surface of the dielectric.

5. The electrostatic chuck of claim 4 wherein the recessed portions comprise grooves that are used to hold a heat transfer fluid for regulating the temperature of the substrate held on the chuck.

6. The electrostatic chuck of claim 1 wherein the dielectric comprises a resistivity of from about $10^8$ to about $10^{16}$ Ω-cm.

7. The electrostatic chuck of claim 1 wherein the discharge electrode comprises a switch for switching the discharge electrode to electrical ground, or to an electrical potential that depletes the residual charge in the chuck.

8. The electrostatic chuck of claim 1 wherein the dielectric comprises an electrical resistance sufficiently low to electrostatically hold the substrate by non-coulombic electrostatic pressure upon application of a voltage to the charging electrode.

9. A method of using the electrostatic chuck of claim 1 comprising the steps of:
  (a) placing the substrate on the receiving surface of the dielectric and applying a voltage to the charging electrode to electrostatically hold the substrate;
  (b) terminating the voltage applied to the charging electrode and applying to the discharge electrode an electrical potential for removing or neutralizing residual electrostatic charge in the chuck; and
  (c) removing the substrate from the receiving surface of the dielectric.

10. A method of using the electrostatic chuck of claim 1 comprising the steps of:
  (a) placing a substrate on the receiving surface of the dielectric and applying a voltage to the charging electrode to electrostatically hold the substrate;
  (b) electrically grounding the charging electrode;
  (c) applying to the discharge electrode an electrical potential for depleting residual electrostatic charge in the chuck; and
  (d) removing the substrate from the receiving surface of the dielectric.

11. An electrostatic chuck for holding and rapidly releasing a substrate, the chuck comprising:
  (a) a dielectric having a receiving surface for receiving the substrate, the dielectric comprising an electrical resistance sufficiently low to allow the substrate to be electrostatically held by non-coulombic electrostatic pressure;
  (b) a charging electrode in the dielectric for generating electrostatic charge for electrostatically holding the substrate to the receiving surface of the dielectric; and
  (c) a discharge electrode in the dielectric, the discharge electrode comprising conductor elements having exposed contact ends terminating at the receiving surface of the dielectric to provide an electrical pathway for removing or neutralizing residual electrostatic charge accumulated in the dielectric.

12. The electrostatic chuck of claim 11 wherein the contact ends of the conductor elements are electrically isolated from the substrate.

13. The electrostatic chuck of claim 12 wherein the contact ends of the conductor elements terminate in recessed portions in the receiving surface of the dielectric.

14. The electrostatic chuck of claim 13 wherein the recessed portions of the dielectric comprise grooves for holding heat transfer fluid for regulating the temperature of the substrate held on the chuck.

15. The electrostatic chuck of claim 11 wherein the charging electrode comprises apertures, and wherein the conductor elements of the discharge electrode extend through the apertures and are electrically isolated from the charging electrode.

16. The electrostatic chuck of claim 11 further comprising a voltage supply for applying to the discharge electrode an electrical potential that dissipates or neutralizes the residual electrostatic charge in the dielectric.

17. A method of forming an electrostatic chuck comprising the steps of:
  (a) forming at least two dielectric plates and forming an electrical conductor layer on one of the dielectric plates;
  (b) joining the dielectric plates to one another so that the electrical conductor layer is enclosed by the dielectric plates to serve as a charging electrode and forming an electrical discharge member having a portion extending through one of the dielectric plates to serve as a discharge electrode; and
  (c) sintering the dielectric plates, the electrical conductor layer, and the electrical discharge member to form an electrostatic chuck.

18. The method of claim 17 wherein step (a) comprises the steps of:
  (1) preparing a slurry comprising ceramic particles, liquid carrier, and a binder;
  (2) applying a layer of the slurry to a support film; and
  (3) drying the layer of slurry on the support film to form the dielectric plates.

19. The method of claim 17 wherein the electrical conductor layer is composed of conducting powder, liquid carrier, and binder.

20. The method of claim 19 wherein the conducting powder comprises tungsten, molybdenum, copper, silver, or gold.

21. The method of claim 17 wherein the dielectric plates comprises one or more of aluminum oxide, aluminum nitride, boron nitride, silicon oxide, silicon carbide, silicon nitride, and titanium oxide.

22. A method of forming an electrostatic chuck comprising the steps of:
  (a) forming a first electrical conductor layer on a first dielectric to serve as a charging electrode;
  (b) positioning a second dielectric having holes therethrough over the first electrical conductor layer on the first dielectric; and
  (c) filling the holes in the second dielectric with electrical conductor material to form one or more conductor elements to serve as a discharging electrode that extends from the electrical conductor layer through the second dielectric and that comprises exposed contact portions on the surface of the second dielectric.

23. The method of claim 22 wherein the first and second dielectrics comprise dielectric plates formed by tape casting.

24. The method of claim 22 wherein the second dielectric comprises a second electrical conductor layer and wherein the holes in the second dielectric extend through the second electrical conductor layer.

25. A method of forming an electrostatic chuck comprising the steps of:
  (a) forming a dielectric having a receiving surface for receiving a substrate thereon;

(b) forming a charging electrode in the dielectric, and forming an electrical connector connected to the charging electrode, the electrical connector having an exposed portion for receiving charge for electrostatically charging the charging electrode to hold the substrate to the receiving surface of the dielectric; and (c) forming a discharge electrode in the dielectric, the discharge electrode being electrically isolated from the charging electrode and having exposed portions that serve to remove electrostatic charge accumulated in the dielectric.

26. The method of claim 25 wherein step (c) comprises the steps of forming apertures in the charging electrode and extending the exposed portions of the discharge electrode through the apertures.

27. The method of claim 26 comprising the step of terminating the exposed portions of the discharge electrode on the receiving surface of the dielectric so that the exposed portions are electrically isolated from the substrate.

28. The method of claim 27 comprising the steps of forming recessed portions in the receiving surface of the dielectric and locating the exposed portions of the discharge electrode within the recessed portions.

29. The method of claim 28 further comprising the step of forming grooves in the dielectric to hold a heat transfer fluid for regulating the temperature of the substrate held on the dielectric, the grooves comprising the recessed portions.

30. The method of claim 25 wherein in step (a) the dielectric is formed by the steps of:

(1) preparing a slurry comprising ceramic particles, liquid carrier, and a binder;

(2) applying a layer of the slurry to a support film; and (3) drying the layer of slurry on the support film to form the dielectric.

31. The method of claim 30 wherein one or more of the charging electrode and discharge electrode are formed of conducting powder, liquid carrier, and binder.

32. The method of claim 25 wherein the dielectric is formed of one or more of aluminum oxide, aluminum nitride, boron nitride, silicon oxide, silicon carbide, silicon nitride, or titanium oxide.

* * * * *